United States Patent
Herzig et al.

(10) Patent No.: US 9,686,122 B2
(45) Date of Patent: Jun. 20, 2017

(54) METHODS FOR ORIENTATION AND TILT IDENTIFICATION OF PHOTOVOLTAIC SYSTEMS AND SOLAR IRRADIANCE SENSORS

(71) Applicants: Michael Herzig, Edgewater, NJ (US); Matthew Williams, San Francisco, CA (US); Shawn Kerrigan, Redwood City, CA (US)

(72) Inventors: Michael Herzig, Edgewater, NJ (US); Matthew Williams, San Francisco, CA (US); Shawn Kerrigan, Redwood City, CA (US)

(73) Assignee: Locus Energy, Inc.

( * ) Notice: Subject to any disclaimer, the term of this patent is extended or adjusted under 35 U.S.C. 154(b) by 607 days.

(21) Appl. No.: 13/681,803

(22) Filed: Nov. 20, 2012

(65) Prior Publication Data

US 2013/0152998 A1 Jun. 20, 2013
US 2016/0322528 A9 Nov. 3, 2016

Related U.S. Application Data

(63) Continuation-in-part of application No. 12/777,235, filed on May 10, 2010, now Pat. No. 8,862,432.
(Continued)

(51) Int. Cl.
*G06G 7/54* (2006.01)
*H04L 12/24* (2006.01)
(Continued)

(52) U.S. Cl.
CPC ............ *H04L 41/026* (2013.01); *F24J 2/38* (2013.01); *G06F 17/5009* (2013.01); *F24J 2200/04* (2013.01)

(58) Field of Classification Search
CPC ............ G06F 2217/78; G06F 17/5022; G06F 17/5036
(Continued)

(56) References Cited

U.S. PATENT DOCUMENTS 3,872,286 A 3/1975 Putman
4,280,061 A 7/1981 Lawson-Tancred
(Continued)

FOREIGN PATENT DOCUMENTS

WO 0225987 A2 3/2002
WO 2006119031 11/2006

OTHER PUBLICATIONS

Li, Danny HW, and Tony NT Lam. "Determining the optimum tilt angle and orientation for solar energy collection based on measured solar radiance data." International Journal of Photoenergy 2007 (2007).*
(Continued)

*Primary Examiner* — Omar Fernandez Rivas
*Assistant Examiner* — Cuong Luu
(74) *Attorney, Agent, or Firm* — Jennifer Meredith, Esq.; Meredith & Keyhani, PLLC

(57) ABSTRACT

The present invention relates to methods and systems for identifying PV system and solar irradiance sensor orientation and tilt based on energy production, energy received, simulated energy production, estimated energy received, production skew, and energy received skew. The present invention relates to systems and methods for detecting orientation and tilt of a PV system based on energy production and simulated energy production; for detecting the orientation and tilt of a solar irradiance sensor based on solar irradiance observation and simulated solar irradiance observation; for detecting orientation of a PV system based on energy production and energy production skew; and for
(Continued)

detecting orientation of a solar irradiance sensor based on solar irradiance observation and solar irradiance observation skew.

9 Claims, 13 Drawing Sheets

Related U.S. Application Data

(60) Provisional application No. 61/576,313, filed on Dec. 15, 2011, provisional application No. 61/576,315, filed on Dec. 15, 2011.

(51) Int. Cl.
*F24J 2/38* (2014.01)
*G06F 17/50* (2006.01)

(58) Field of Classification Search
USPC .......................................................... 703/18
See application file for complete search history.

(56) References Cited

U.S. PATENT DOCUMENTS

| | | | |
|---|---|---|---|
| 4,752,697 A | 6/1988 | Lyons | |
| 6,311,137 B1 | 10/2001 | Kurokami | |
| 7,020,566 B2 | 3/2006 | Villicana | |
| 7,133,787 B2 | 11/2006 | Mizumaki | |
| 7,742,897 B2 | 6/2010 | Herzig | |
| 8,682,585 B1 | 3/2014 | Hoff | |
| 2002/0033020 A1 | 3/2002 | Tonomura | |
| 2002/0143693 A1 | 10/2002 | Soestbergen | |
| 2004/0067746 A1 | 4/2004 | Johnson | |
| 2004/0103056 A1 | 5/2004 | Ikeda | |
| 2004/0138977 A1 | 7/2004 | Tomkins | |
| 2004/0148336 A1 | 7/2004 | Hubbard et al. | |
| 2004/0176965 A1 | 9/2004 | Winch | |
| 2004/0177027 A1 | 9/2004 | Adachi | |
| 2004/0230377 A1 | 11/2004 | Ghosh | |
| 2004/0236587 A1 | 11/2004 | Nalawade | |
| 2005/0004839 A1 | 1/2005 | Bakker | |
| 2005/0131810 A1 | 6/2005 | Garrett | |
| 2006/0271214 A1 | 11/2006 | Brown | |
| 2007/0162367 A1 | 7/2007 | Smith | |
| 2007/0174219 A1 | 7/2007 | Bryant | |
| 2007/0203860 A1 | 8/2007 | Golden | |
| 2007/0219932 A1 | 9/2007 | Carroll | |
| 2007/0226163 A1 | 9/2007 | Robles | |
| 2008/0091590 A1 | 4/2008 | Kremen | |
| 2008/0091625 A1 | 4/2008 | Kremen | |
| 2008/0172256 A1 | 7/2008 | Yekutiely | |
| 2008/0215500 A1 | 9/2008 | De | |
| 2009/0177458 A1 | 7/2009 | Hochart | |
| 2010/0219983 A1* | 9/2010 | Peleg et al. | 340/870.17 |
| 2010/0271222 A1* | 10/2010 | Kerrigan et al. | 340/635 |
| 2011/0282601 A1 | 11/2011 | Hoff | |
| 2013/0085885 A1 | 4/2013 | Sahai et al. | |

OTHER PUBLICATIONS

Prusa et al. Performance of a Small Network of Grid Interactive Residential Solar Photovoltaic Systems Proceedings of ES2008 Energy Sustainability 2008.*
Hammer et al. 432,2005 Solar Energy Assessment Using Remote Sensing Technologies Remore Sensing of Environment 86, pp. 423-432, 2005.
Kroposki et al.Photovoltaic Module Energy Rating Methodology Development 25th PVSC, May 13-17, 1996.
'Atlas DCA', Peak electronic design, ltd., 2008.
Burger, Werner, Asset Securitisation, 2006, pp. 1-67.
Wang, Jianhui, The Application of Grey System Theory in Asset Securitizaton, 2007, pp. 1-3.

* cited by examiner

Figure 2 - Potential Components

METHODS FOR ORIENTATION AND TILT IDENTIFICATION OF PHOTOVOLTAIC SYSTEMS AND SOLAR IRRADIANCE SENSORS

This application claims priority to provisional patent application No. 61/576,313 filed Dec. 15, 2011 entitled "Methods for Orientation and Tilt Identification of Photovoltaic Systems and Solar Irradiance Sensors," and provisional patent application No. 61/576,315 filed Dec. 15, 2011 entitled, "Methods for Location Identification of Renewable Energy Systems and Environmental Sensors from Energy Production and Sensor Measurements" which are both incorporated herein by reference. This application is a continuation-in-part of and claims priority to application Ser. No. 12/777,235 filed May 10, 2010 entitled, "AUTOMATIC SYSTEM INFORMATION DETERMINATION OF DISTRIBUTED RENEWABLE ENERGY SYSTEMS" (now issued as U.S. Pat. No. 8,862,432) the entire contents of which are incorporated herein by reference.

One of the greatest obstacles to adoption of distributed photovoltaic projects is the ability to efficiently monitor and analyze a fleet of systems and solar irradiance sensors. There currently exist several monitoring solutions with analytics based on solar resource received. Solar irradiance sensors, such as pyranometers or reference cells, are placed at a location with or without a PV system to measure solar irradiance received. PV system and solar irradiance sensor orientation, the direction at which the device is angled, and tilt, the angle at which the device is raised, are major determinants of solar energy received and consequentially energy produced by PV systems. While solar irradiance based analytics have proven effective in monitoring, orientation and tilt among other variables describing a PV system or solar irradiance sensor are user inputs and subject to human error. When system parameters are incorrectly identified it is difficult to employ analytical algorithms reliant upon solar irradiance due to the errors caused by incorrect amounts of solar resource received. It is difficult to accurately monitor and analyze a fleet of projects with these errors, thus the need for systems and methods for correctly identifying the orientation and tilt of a PV system and solar irradiance sensors.

In order to efficiently manage and operate PV projects, energy production must be monitored and analyzed. Several solutions to this problem currently exist, employing monitoring hardware on location and running analytical algorithms on the data. As solar irradiance is the driver of PV energy production, some of these analytical algorithms are based on solar resource received by a system. Solar irradiance reaching a PV system or a solar irradiance sensor is determined by location, orientation, and tilt of the hardware among other variables and the analytical algorithms leverage this information to evaluate PV system performance. The process of deploying PV systems and solar irradiance sensors in the field involves several parties including OEMs, financiers, and distributors among others. Many of these parties have interest in monitoring their systems, although they may be several layers away from the end user. Due to the separation, interested parties may have partially complete or incorrect information about these systems. This separation can limit the benefits associated with monitoring and analyzing PV projects, thus the need for methodology to accurately identify the orientation and tilt of the hardware used in the projects. This patent describes the methodologies for identifying orientation and tilt of PV systems based on energy production and orientation and tilt of solar irradiance sensors based on the solar irradiance observed. A correlation based methodology leverages a PV production model and iterates through orientation and tilt in order to identify a system's orientation and tilt. A correlation based methodology leverages solar irradiance models and iterates through orientation and tilt in order to identify a solar irradiance sensor's orientation and tilt. An energy production skew based methodology leverages differences between morning and evening production in order to identify a system's tilt. A measured solar irradiance skew based methodology leverages differences between morning and evening observed solar irradiance in order to identify a sensor's tilt.

These and other features, aspects and advantages of the present invention will become better understood with reference to the following description and claims.

SUMMARY OF THE INVENTION

The present invention relates to methods and systems for identifying PV system and solar irradiance sensor orientation and tilt based on energy production, energy received, simulated energy production, estimated energy received, production skew, and energy received skew. The present invention relates to systems and methods for detecting orientation and tilt of a PV system based on energy production and simulated energy production; for detecting the orientation and tilt of a solar irradiance sensor based on solar irradiance observation and simulated solar irradiance observation; for detecting orientation of a PV system based on energy production and energy production skew; and for detecting orientation of a solar irradiance sensor based on solar irradiance observation and solar irradiance observation skew.

According to one embodiment of the present invention, a computer processor implemented method of identifying the orientation and tilt of a renewable energy system is provided, the method comprising the steps of; providing a set of renewable energy systems having at least two renewable energy systems each having an orientation and tilt angle pair to provide a set of orientation and tilt known renewable energy systems in a computer processor; determining environmental conditions for each of the orientation and tilt known renewable energy systems to provide environmental conditions at each orientation and tilt known renewable energy system in a computer processor; determining simulated production data by a computer processor based on the environmental conditions at each orientation and tilt angle pair to provide simulated production data for each orientation and tilt angle pair known renewable energy system; storing the orientation and tilt angle pair and simulated production data in a computer processor; providing at least one orientation and tilt unknown renewable energy system in a computer processor; calculating by the computer processor a correlation for each orientation and tilt unknown renewable energy systems production data to the simulated production data for each orientation and tilt angle pair known renewable energy systems; setting the orientation and tilt for the orientation and tilt unknown renewable energy systems to the most correlated orientation and tilt known renewable energy systems to become a correlated simulated orientation and tilt known renewable energy systems that is part of the set of renewable energy systems having at least two renewable energy systems each having an orientation and tilt angle pair in the computer processor.

According to another embodiment of the present invention, a computer processor implemented method of identifying the orientation and tilt of a solar irradiance sensor, the method comprising the steps of; providing a set of solar irradiance sensors having at least two solar irradiance sensors each having an orientation and tilt angle pair to provide a set of orientation and tilt known solar irradiance sensors in a computer processor; determining environmental conditions for each of the orientation and tilt known solar irradiance sensors to provide environmental conditions at each orientation and tilt known solar irradiance sensors in a computer processor; determining simulated production data by a computer processor based on the environmental conditions at each orientation and tilt angle pair to provide simulated production data for each orientation and tilt angle pair known solar irradiance sensor; storing the orientation and tilt angle pair and simulated production data in a computer processor; providing at least one orientation and tilt unknown solar irradiance sensor in a computer processor; calculating by the computer processor a correlation for each orientation and tilt unknown solar irradiance sensors production data to the simulated production data for each orientation and tilt angle pair known solar irradiance sensors; setting the orientation and tilt for the orientation and tilt unknown solar irradiance sensor to the most correlated orientation and tilt known renewable solar irradiance sensors to become a correlated simulated orientation and tilt known solar irradiance sensor that is part of the set of set of renewable energy systems having at least two solar irradiance sensors each having an orientation and tilt angle pair in a computer processor.

According to another embodiment of the present invention, a computer processor implemented method of identifying the orientation of a renewable energy system, the method comprising the steps of; providing at least one orientation unknown renewable energy system having production data in a computer processor; storing the production data in a computer processor; filtering the production data day by day for favorable weather conditions by a computer processor to provide filtered production data for each filtered day; identifying and saving the start of production, peak of production and end of production for each filtered day in a computer processor; calculating a skew of observation for one of the at least one orientation unknown renewable energy systems by a computer processor according to the start of production, peak of production and end of production for each filtered day; calculating an orientation for the one of the at least one orientation unknown renewable energy systems by a computer processor according to the skew of observation; setting the orientation for the one of the at least one orientation unknown renewable energy systems to become an orientation known renewable energy system that becomes part of a set of orientation known renewable energy systems in a computer processor.

According to another embodiment of the present invention, A computer processor implemented method of identifying the orientation of a solar irradiance sensor, the method comprising the steps of; providing an orientation—unknown solar irradiance sensor having solar irradiance sensor data in a computer processor; storing the solar irradiance sensor data in a computer processor; filtering the solar irradiance sensor data day by day for favorable weather conditions by a computer processor to provide filtered solar irradiance sensor data for each filtered day; identifying and saving the start of production, peak of production and end of production for each filtered day in a computer processor; calculating a skew of observation for each the solar irradiance sensor by a computer processor according to the start of production, peak of production and end of production for each filtered day; calculating the orientation of the solar irradiance sensor by a computer processor according to the skew of observation; setting the orientation for the orientation-unknown solar irradiance sensor to become an orientation-known solar irradiance sensor that becomes part of a set of orientation-known solar irradiance sensors in a computer processor.

These and other features, aspects and advantages of the present invention will become better understood with reference to the following description and claims.

DETAILED DESCRIPTION OF THE INVENTION

Figure 1:
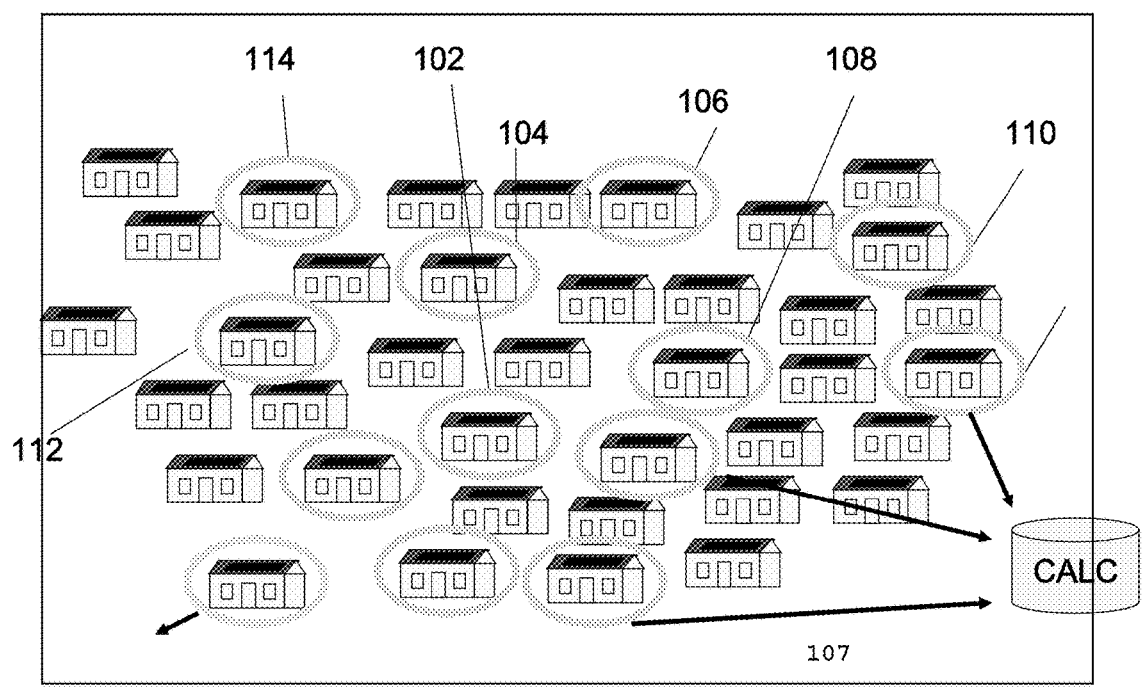
FIG. 1 depicts the present invention.
Figure 2:
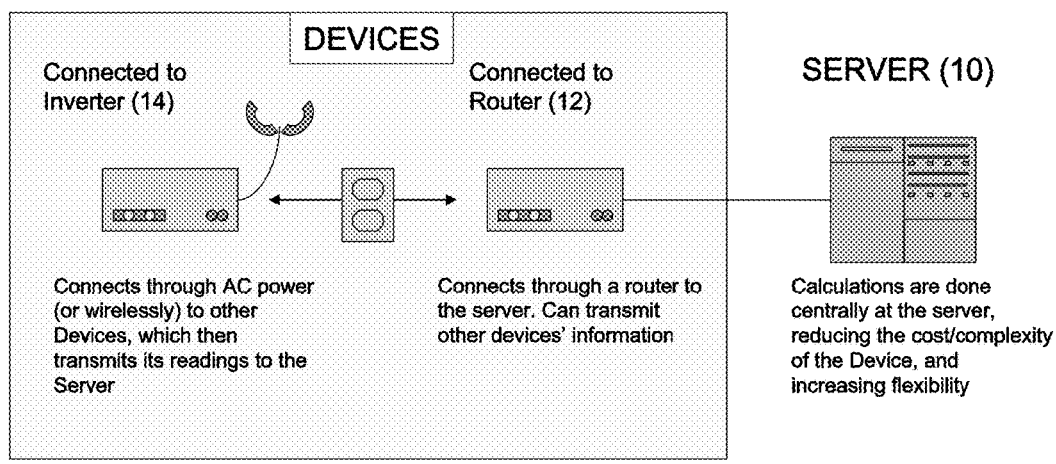
FIG. 2 depicts the present invention.
Figure 3:
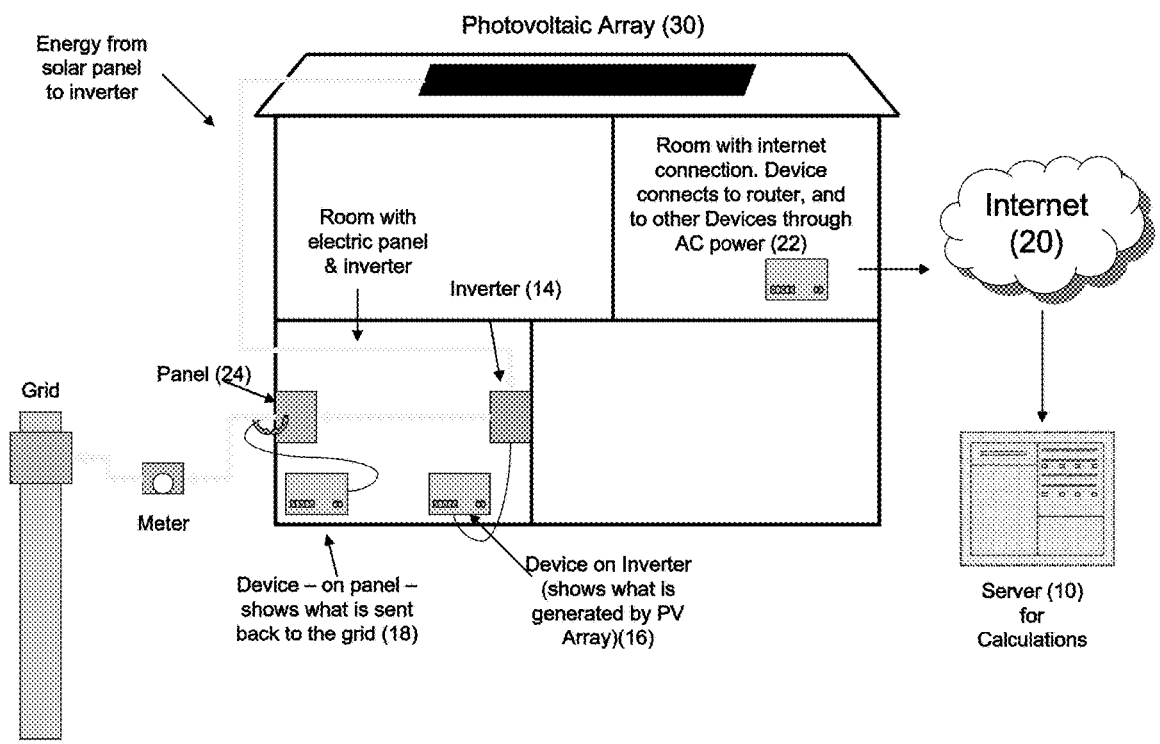
FIG. 3 depicts the present invention.
Figure 4:
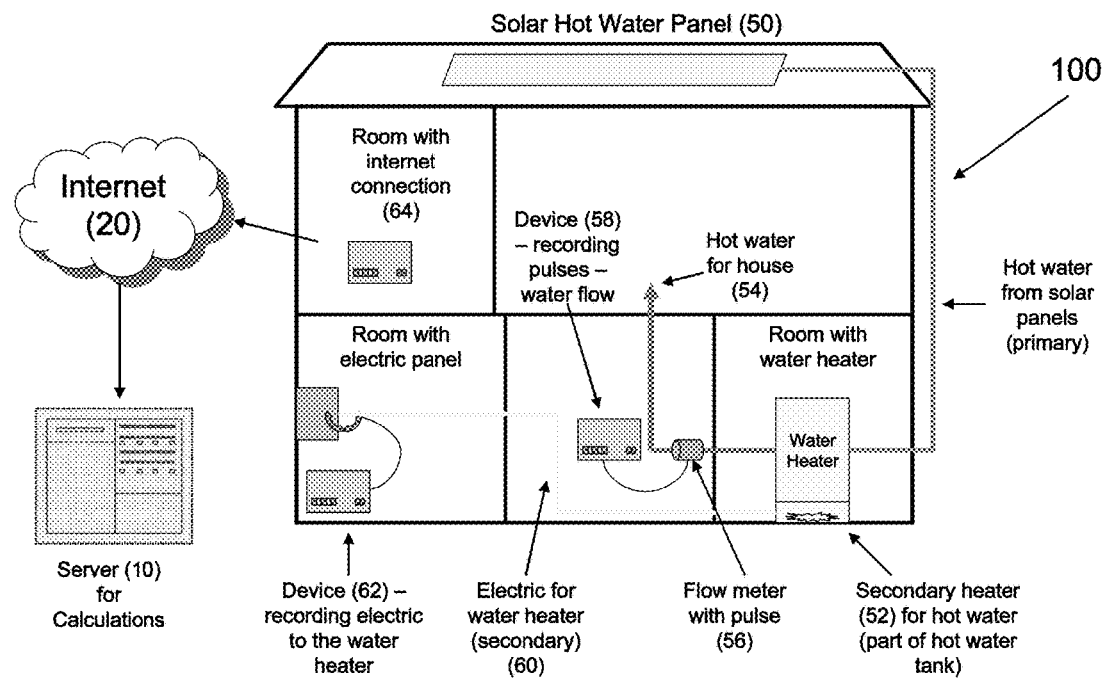
FIG. 4 depicts the present invention.
Figure 5:
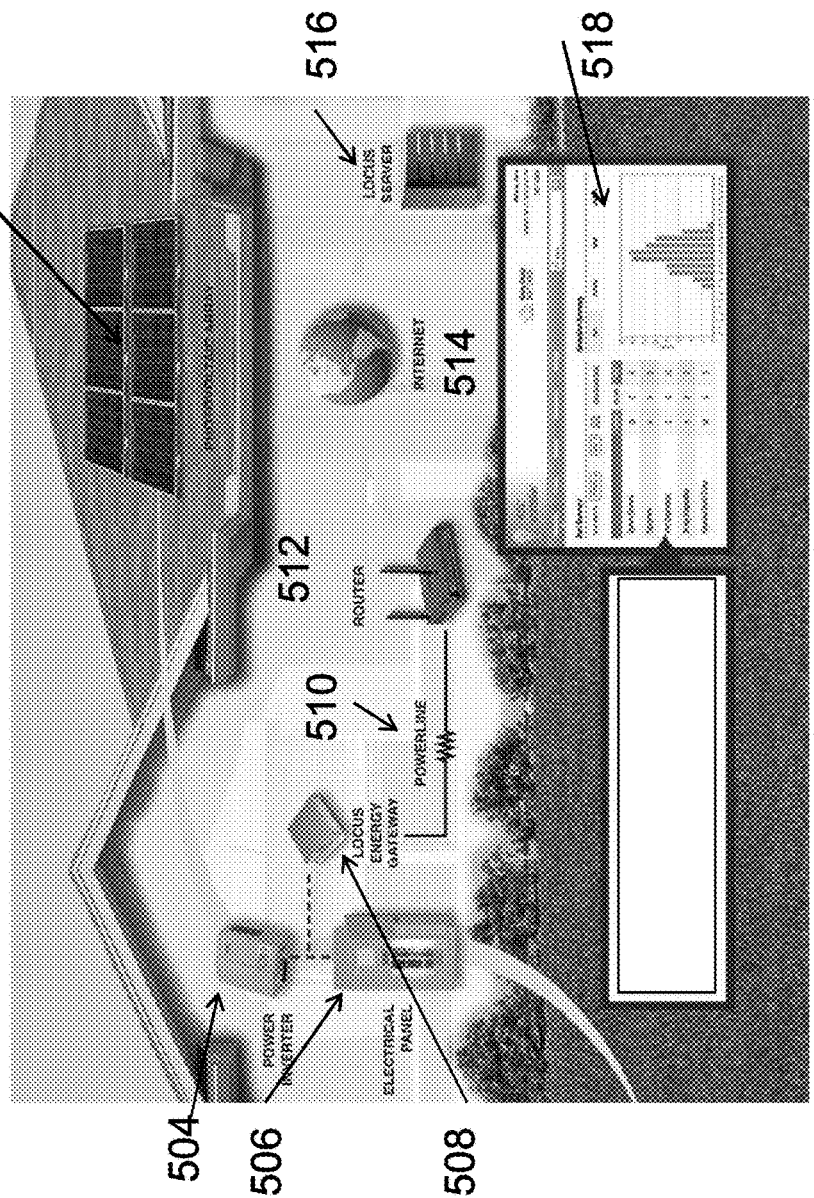
FIG. 5 depicts the present invention.

The following detailed description is of the best currently contemplated modes of carrying out the invention. The description is not to be taken in a limiting sense, but is made merely for the purpose of illustrating the general principles of the invention, since the scope of the invention is best defined by the appended claims.

FIGS. 1-5 provide examples of a monitored renewable energy system (more specifically a photovoltaic array solar panel also referred to herein as a solar photovoltaic system or solar powered system) from which information may be obtained. According to the example shown, there is a server 10 and at least one monitored renewable energy system (e.g. 102, 104, 106, 108, 110, 112) which is provided to a user or consumer. There may be at least one data server (10), at least one generation monitoring device (16) in communication with the monitored renewable energy system (at premise monitored renewable energy system (30)) and at least one communication node (22) in communication with at least one of the monitored renewable energy system (30), the generation monitoring device (16) and the data server (10). It should be understood the data server may be a single computer, a distributed network of computers, a dedicated server, any computer processor implemented device or a network of computer processor implemented devices, as would be appreciated by those of skill in the art. The monitored renewable energy system may have background constants that are entered into the system during data setup; populating this part of the data structure is one of the initial steps to the process. During this time, all required (or potentially required) background information may be loaded into the system. This data will later be used for system calculations and diagnostics. Background constants may include: (1) Full Calendar with sunrise and sunset according to latitude throughout the year; (2) Insolation or 'incident solar radiation': This is the actual amount of sunlight falling on a specific geographical location. There are expected amounts of radiation which will fall on an area each day, as well as an annual figure. Specific Insolation is calculated as kWh/m2/day. The importance of this variable is that it can combine several other Background Constants; and (3) Location Functionality. It is envisioned that some of this information may be input and some may be determined automatically. The proximity of each system to each other system may be determined, and forms a part of the methods used to determine the geographic average of the renewable energy systems. While there are different specific methods of implementing Location Functionality, generally this relies on a large database of locations which are tied to zones. Because the relational distances between the zones are stored within the software, the distances between any two locations can then be easily and accurately calculated.

The term production data refers to any data that is received from the renewable energy system and/or solar irradiance sensor. The energy generated by each monitored renewable energy system and/or solar irradiance sensor is recorded as production data and the data server may then determine comparative information based upon at least one of the background constant, the diagnostic variable, the system coefficient and the energy generated to determine a comparative value of the monitored renewable energy system. The term comparative value is intended to include any value that compares one system to another system or a group of systems. For example, this may be as simple as an "underperforming" designation when the system's performance is less than another system or group of systems performance in terms of power generated.

A sample system may have at least one inverter (14) in communication with the monitored renewable energy system (e.g. 50, 30). The inverter (14) is an electronic circuit that converts direct current (DC) to alternating current (AC). There may also be at least one return monitor (18) determining the energy returned to a grid by the at-least one monitored renewable energy system. At least one background constant may be determined and saved in the data server(s). The monitored renewable energy system (e.g. 30, 50) may be at least partially powered by at least one alternate energy source. There may be at least one generation monitoring device (e.g. 58), which calculates the energy generated at each consumer's premises by the monitored renewable energy system (e.g. 30, 50); at least one communication node (64) in communication with each at least one generation monitoring device (e.g. 58); at least one data server (10) in communication with communication node (e.g. 64), wherein the data server(s) (10) accept information from the communication node (e.g. 64) to determine the power generated at a first user's premises (100) and compare the power generated at a first user's premises (100) to Comparative Information obtained from at least two monitored renewable energy systems (e.g. 102, 104, 106, 108, 110, 112, 114) to determine if the first user's monitored renewable energy system (100) is within a predetermined deviation from the comparative information. This may provide a comparative value. The communication node may be further comprising a data storage means for storing usage information. For example, the communication node (64) may be a computer with a hard drive that acts as a data storage means for storing usage information. The generation monitoring device may be selected from the group consisting of pulse meter, temperature meter, electromechanical meter, solid state meter, flow meter, electric meter, energy meter and watt meter. There may also be at least one return monitoring device in communication with the inverter which calculates the energy returned to a grid by the system.

The monitored renewable energy system may be, for example, a solar system, solar panel system, photovoltaic, thermal, wind powered, geothermal, hydropower. A secondary energy source (e.g. 52) may be in communication with and at least partially powering the monitored renewable energy system. It should be understood, though, this is only for ancillary power in the event that the renewable energy source (50) is not capable of entirely powering the at premise monitored renewable energy system.

The generation monitoring device may be any type of meter, by way of example, this may include a pulse meter, temperature meter, electromechanical meter, solid state meter, flow meter, electric meter, energy meter and watt meter. An installation will have a communication node or hub set up at the location with the system. One of the communication nodes may act as a hub. These devices connect to the internet and send the data collected by the nodes to the Server. They have the following properties: The hub has a web server and connects to a standard internet connection (Ethernet). It does not require a computer or other device to make this connection. Each hub has its own unique IP or DNS address. The hub is configured by a web browser. The web browser allows the hub to have specific nodes assigned to it. This set up feature will allow another hub in the area to be set up with its own nodes so that all can operate wirelessly without disruption. Also, the hub is able to configure specific aspects of the hub, such as the connection with the server, data recording and time settings and the ability to configure the attached nodes, including their recording properties.

Each installation may have two or more Data Nodes. These are typically connected wirelessly to the Hub, and connected directly to the inputs/outputs from the Solar Hot Water system. They communicate constantly with the Hub, transferring data which the Hub then sends up to the server. They may have the following properties: The first Required Node connects to a flow meter attached to the Water Tank that is connected to the Solar Hot Water system. This Node will operate as a pulse meter, 'clicking' whenever a unit (either a gallon or a liter) of hot water passes from the tank. The second Required Node connects to either the electric panel at the switch for the Hot Water tank's electric power OR to a flow/other meter for gas/oil to the secondary heater for the Hot Water tank. The Node may have a data storage means for storing flow/usage information. Together, the data gathered from these Required Node connections allow the software on the serve to convert the utilized hot water into an accurate reading of utilized solar energy by subtracting the energy required to by the secondary heating mechanism. The term utilized generation refers to the energy generated by the at-premise power system, less any energy that has not been consumed by the at premise power system (e.g. the energy used to heat water that remains in the tank and is not subsequently used). Note that the term "at-premise power system" is one type of monitored renewable energy system, as claimed. There may also be other Nodes, which may be used to measure other aspects of the system and gain even more accurate readings. For example: the temperature of the hot water on an ongoing basis. The system may be monitored from a remote location (such as a computer in a different location).

The components node (100), hub (102) and server (10) make up the required core components needed to accurately measures the actual usable output from a Solar Hot Water (SHW) system. Essentially, the hub (102) connects to multiple nodes (100) which simultaneously measure the secondary power going into the system along with the hot water going out. Controlling for any background power requirements (e.g. for pumping), it can measure the usable BTUs created by solar by analyzing the measurements at the server (104) level.

The renewable energy system may be a solar system, solar panel system, photovoltaic, thermal, wind powered, geothermal, hydropower or any other renewable energy system. Also, the terms at-premises, on premises and at-premise are interchangeable and equivalent. Additionally, for those interested in heating and cooling their dwelling via renewable energy, geothermal heat pump systems that tap the constant temperature of the earth, which is around 7 to 15 degrees Celsius a few feet underground, are an option and save money over conventional natural gas and petroleum-fueled heat approaches.

The method may further comprise the steps of: monitoring the system from a remote location; and monitoring the utilized generation from a remote location. The method may comprise the steps of: generating an alert when the customer variables are a prescribed percentage different than historical averages. The method may also comprise the steps of monitoring and storing the consumer's customer variables and utilized generation.

The present invention provides a computer processor implemented method of identifying the orientation and tilt of a renewable energy system (e.g. 102, 106, 108), the method comprising the steps of; providing a set of renewable energy systems having at least two renewable energy systems each having an orientation and tilt angle pair to provide a set of orientation and tilt known renewable energy systems in a computer processor. The term "computer processor" is intended to include any computing device, such as a computer, laptop, smart phone and tablet device. The term "orientation and tilt known renewable energy systems" are, just as the name implies, renewable energy systems for which it is known what the orientation and tilt are. The term "orientation and tilt unknown renewable energy systems" are, just as the name implies, renewable energy systems for which the orientation and tile is not known (or unknown). There may be the steps of determining environmental conditions for each of the orientation and tilt known renewable energy system to provide environmental conditions at each orientation and tilt known renewable energy system in a computer processor; determining simulated production data by a computer processor based on said environmental conditions at each orientation and tilt angle pair to provide simulated production data for each orientation and tilt angle pair known renewable energy system; storing the orientation and tilt angle pair and simulated production data in a computer processor; providing at least one orientation and tilt unknown renewable energy system in a computer processor; calculating by the computer processor a correlation for each orientation and tilt unknown renewable energy systems production data to said simulated production data for each orientation and tilt angle pair known renewable energy systems; setting the orientation and tilt for the orientation and tilt unknown renewable energy systems to the most correlated orientation and tilt known renewable energy systems to become a correlated simulated orientation and tilt known renewable energy systems that is part of the set of renewable energy systems having at least two renewable energy systems each having an orientation and tilt angle pair in said computer processor.

Figure 7:
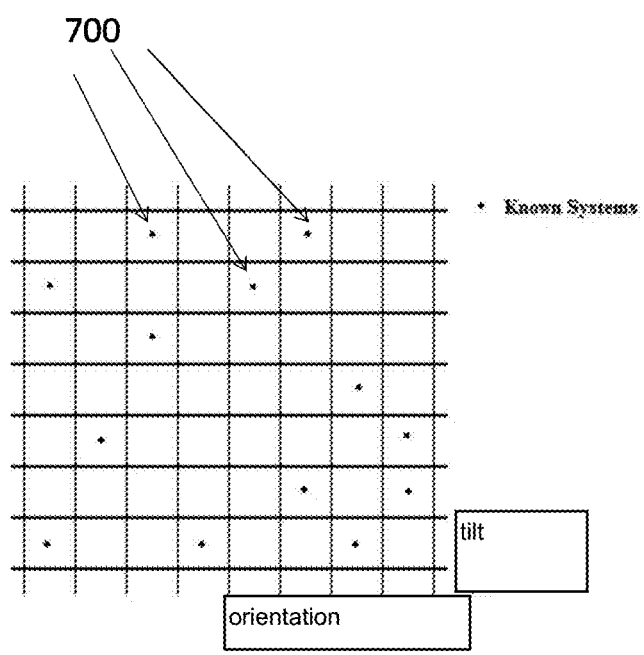
FIG. 7 depicts the present invention.
Figure 8:
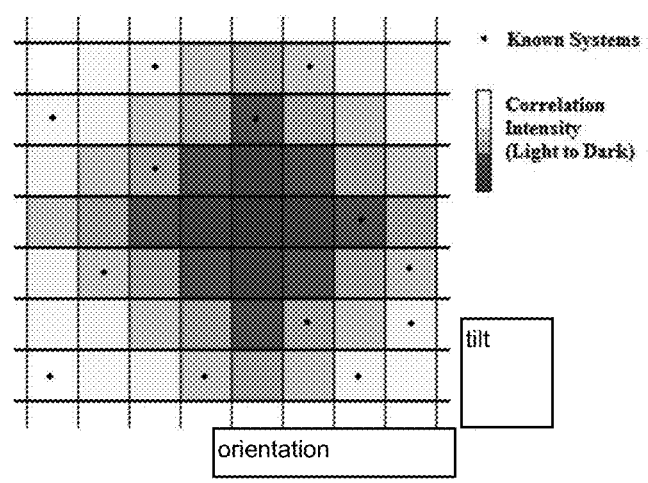
FIG. 8 depicts the present invention.
Figure 9:
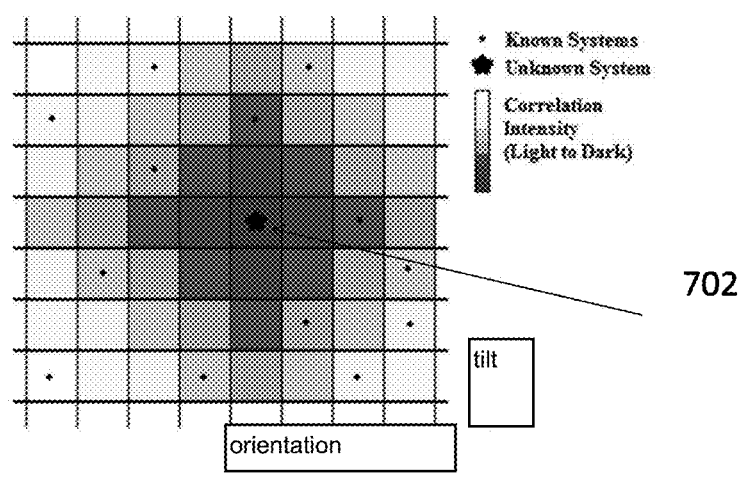
FIG. 9 depicts the present invention.
Figure 10:
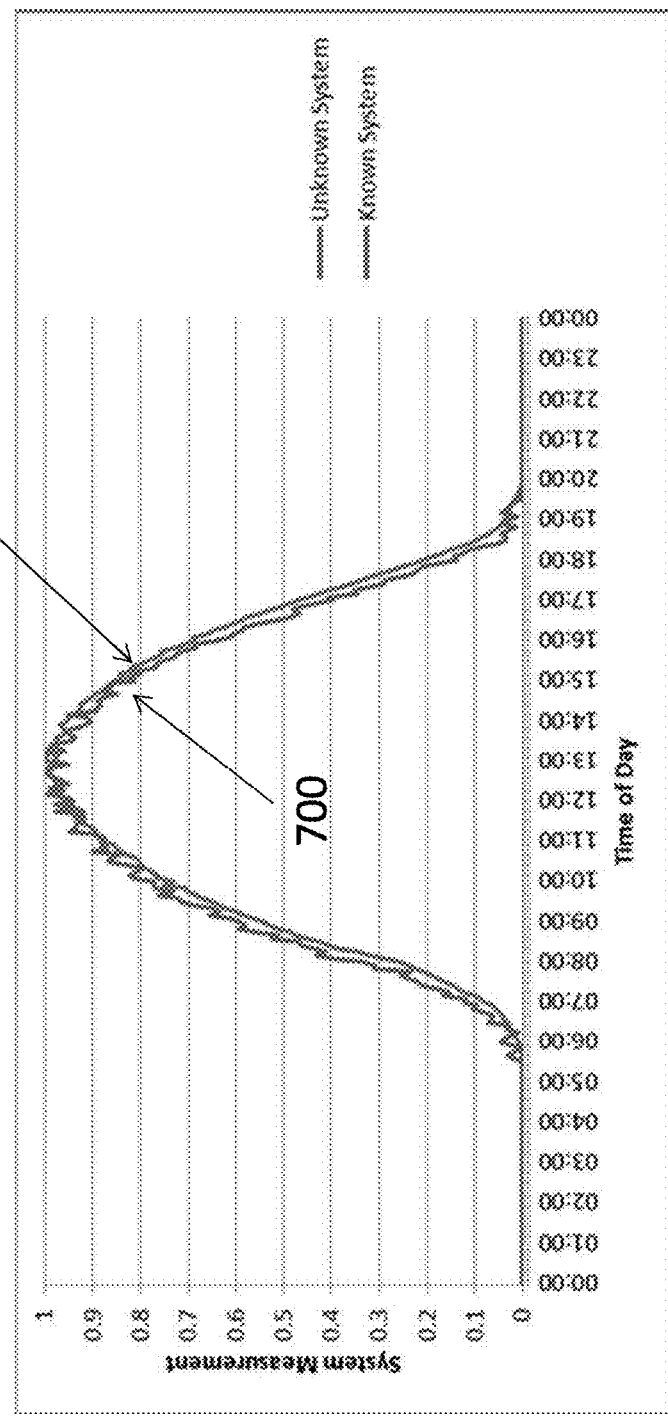
FIG. 10 depicts the present invention.
Figure 11:
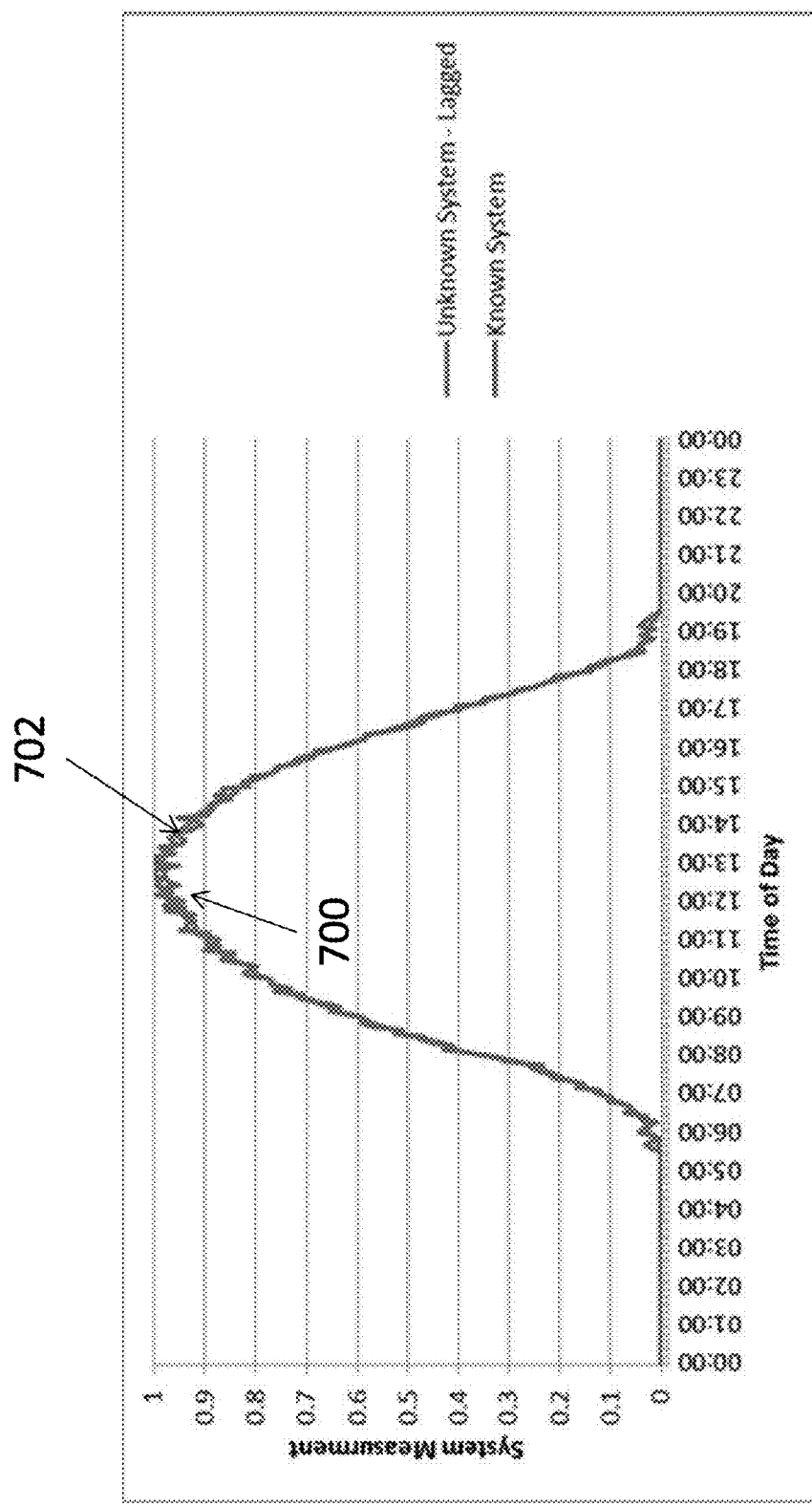
FIG. 11 depicts the present invention.
Figure 12:
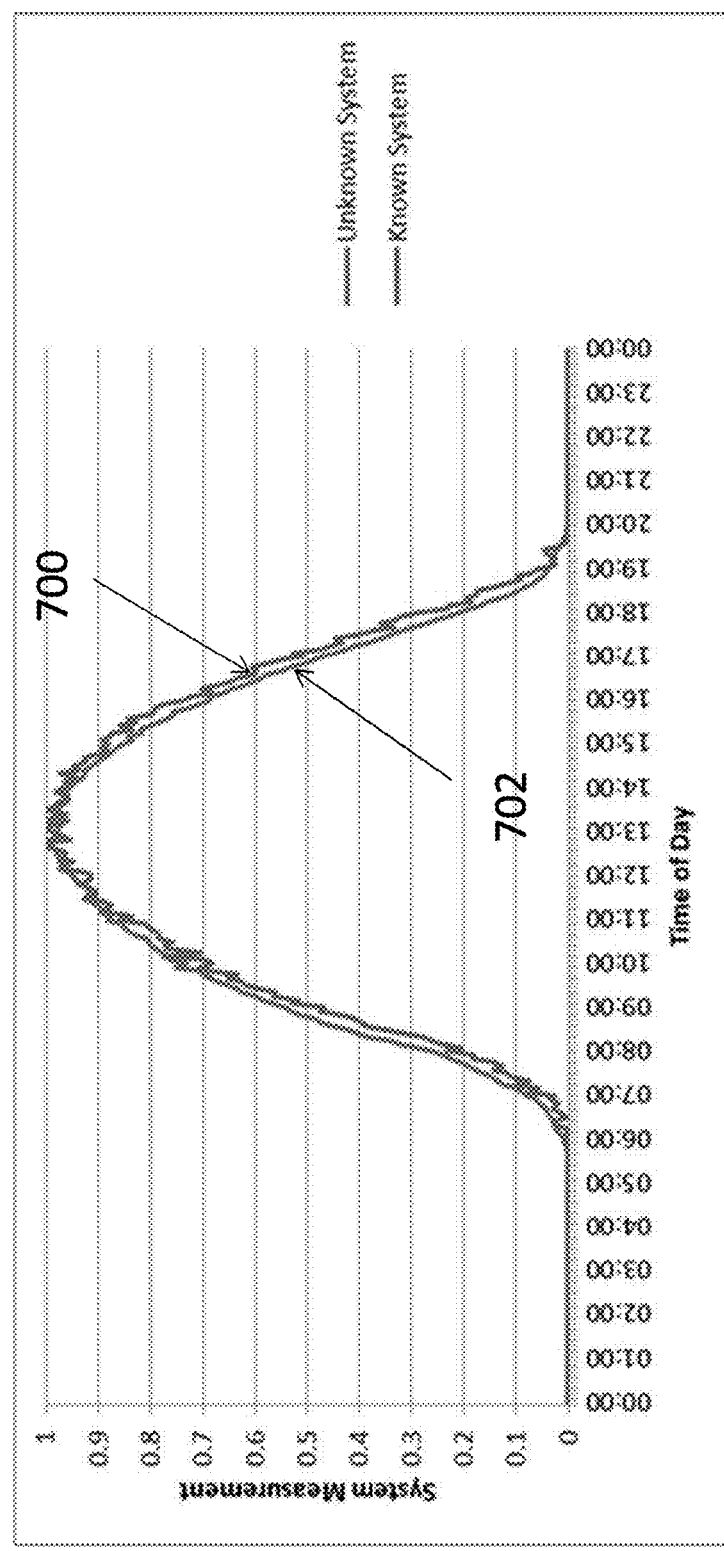
FIG. 12 depicts the present invention.
Figure 13:
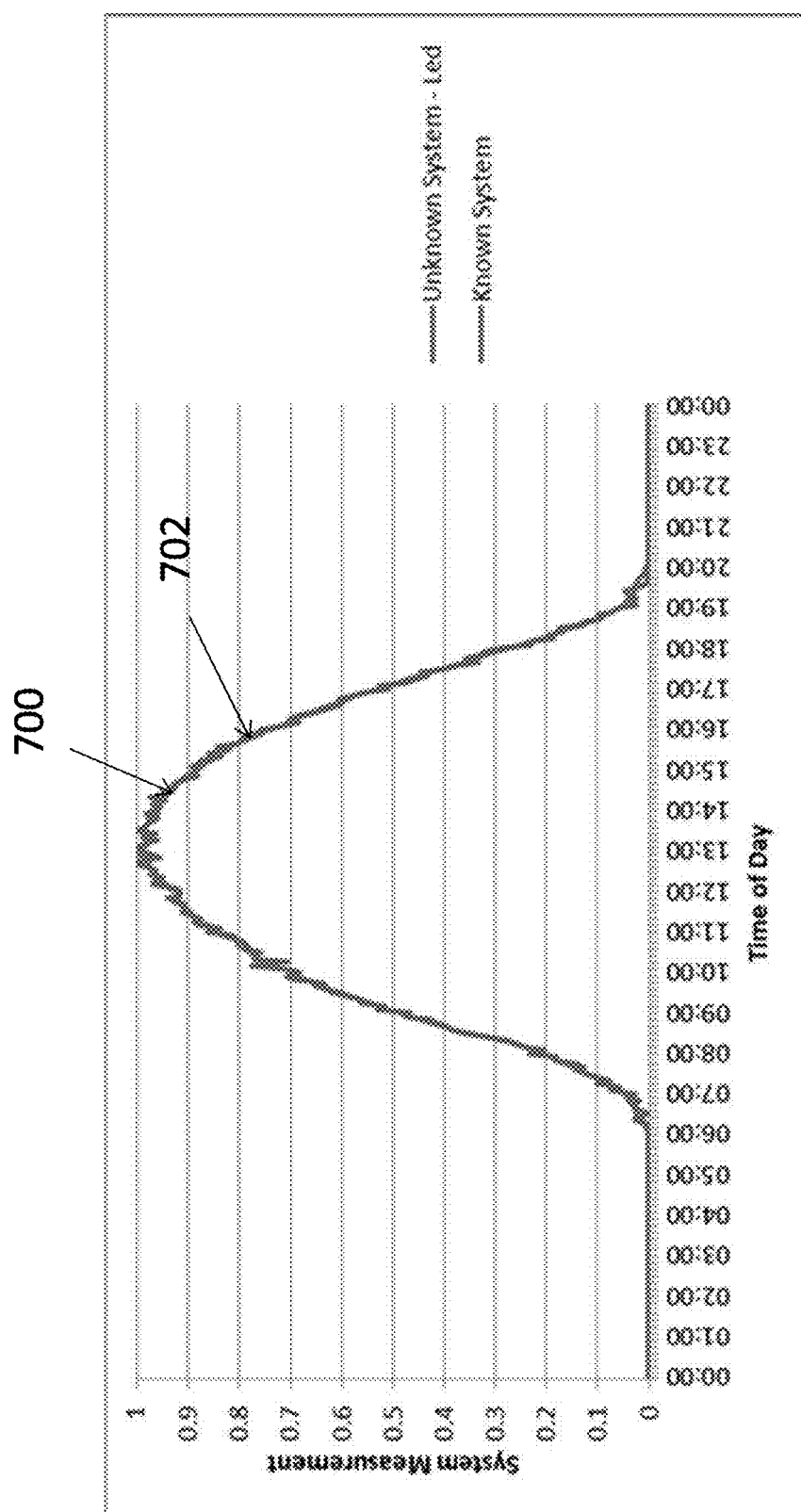
FIG. 13 depicts the present invention.

FIGS. 7-9 depict a triangulation methods of correlating according to the present invention. As shown in FIG. 7, location known renewable energy systems (700) are marked on an orientation and tilt grid. An orientation and tilt unknown renewable energy system (702). One triangulation method may be to set the orientation and tilt to the highest correlated location known system's orientation and tilt. As shown in FIG. 8, the orientation and tilt pair and production data are stored in a computer processor. FIG. 9 depicts correlating a location-unknown renewable energy system (702) to at least one location-known renewable energy system (700). The step of correlating a location may be according to Geospatial interpolation methods, included but not limited to kriging, inverse distance weighting, bilinear interpolation, bicubic interpolation, Barnes interpolation, and spline interpolation (for latitude and longitude).

Correlation is calculated by taking 2 sets of time series data (in our case from an unknown system and a known system) and calculating Pearson's correlation coefficient using those datasets. Using a computer algorithm we calculate correlation from the formula below, where r is correlation, X is data from one set, and Y is data from the other.

$$r = \frac{\sum_{i=1}^{n}(X_i - \overline{X})(Y_i - \overline{Y})}{\sqrt{\sum_{i=1}^{n}(X_i - \overline{X})^2} \sqrt{\sum_{i=1}^{n}(Y_i - \overline{Y})^2}}$$

The correlation based identification logic is for identifying a renewable energy system's orientation and tilt based on the correlation of the system's energy production with observed or simulated energy production at a known location. This logic can also identify an environmental sensor's orientation and tilt based on the correlation of the sensor's observations with observed or simulated environmental conditions.

Production data could come from, without limitation, PV System (kW or kWh), Solar thermal system (kW or kWh), Concentrated solar power system (kW or kWh) and Wind turbine (kW or kWh). Sensor data could come from, without limitation, Pyranometer (W/m^2 or Wh/m^2), Pyrheliometer (W/m^2 or Wh/m^2), PV reference cell (W/m^2 or Wh/m^2), Radiometer (W/m^2 or Wh/m^2), Pyrgeometer (W/m^2 or Wh/m^2), Anemometer (mph or m/s). This type of data consists of a hardware measurement (units listed beside hardware) and a corresponding point in time or time interval, producing a time series of data (multiple time points and data). For example, monitored PV production data is measured every 5 minutes, resulting in a 1 day dataset containing 288 measurements and timestamp pairs.

The production data may be simulated production data according to environmental conditions at the orientation and tilt pair and the step of correlating by the computer processor each orientation and tilt-unknown renewable energy system to at least one orientation and tilt-known renewable energy system is according to the orientation and tilt-known renewable energy systems orientation and tilt and the simulated production data. The environmental conditions at the orientation and tilt pair may be estimated and/or observed.

The renewable energy systems' production data may be selected from the group consisting of photovoltaic system production data, solar thermal system production data, concentrated solar power system production data and wind turbine production data.

Another aspect of the present invention provides a computer processor implemented method of identifying the orientation and tilt of a solar irradiance sensor, the method comprising the steps of; providing a set of solar irradiance sensors having at least two solar irradiance sensors each having an orientation and tilt angle pair to provide a set of orientation and tilt known solar irradiance sensors in a computer processor; determining environmental conditions for each of the orientation and tilt known solar irradiance sensors to provide environmental conditions at each orientation and tilt known solar irradiance sensors in a computer processor; determining simulated production data by a computer processor based on said environmental conditions at each orientation and tilt angle pair to provide simulated production data for each orientation and tilt angle pair known solar irradiance sensor; storing the orientation and tilt angle pair and simulated production data in a computer processor; providing at least one orientation and tilt unknown solar irradiance sensor in a computer processor; calculating by said computer processor a correlation for each orientation and tilt unknown solar irradiance sensors production data to said simulated production data for each orientation and tilt angle pair known solar irradiance sensors; setting said orientation and tilt for said orientation and tilt unknown solar irradiance sensor to the most correlated orientation and tilt known renewable solar irradiance sensors to become a correlated simulated orientation and tilt known solar irradiance sensor that is part of the set of set of renewable energy systems having at least two solar irradiance sensors each having an orientation and tilt angle pair in a computer processor. The solar irradiance sensor may be selected from the group consisting of pyranometer, pyrheliometer and photovoltaic reference cell sensor. The environmental conditions for each of the orientation and tilt known renewable energy systems may be estimated and/or observed.

According to another aspect of the present invention, a computer processor implemented method of identifying the orientation of a renewable energy system, said method comprising the steps of; providing at least one orientation unknown renewable energy system having production data in a computer processor; storing the production data in a computer processor; filtering said production data day by day for favorable weather conditions by a computer processor to provide filtered production data for each filtered day; identifying and saving the start of production, peak of production and end of production for each filtered day in a computer processor; calculating a skew of observation for one of said at least one orientation unknown renewable energy systems by a computer processor according to the start of production, peak of production and end of production for each filtered day; calculating an orientation for said one of said at least one orientation unknown renewable energy systems by a computer processor according to said skew of observation; setting said orientation for said one of said at least one orientation unknown renewable energy systems to become an orientation known renewable energy system that becomes part of a set of orientation known renewable energy systems in a computer processor. The production data may be simulated production data according to environmental conditions at the renewable energy systems location. The environmental conditions may be estimated and/or observed. The renewable energy system may be selected from the group consisting of photovoltaic system, solar thermal system, concentrated solar power system and wind turbine.

According to another aspect of the present invention, a computer processor implemented method of identifying the orientation of a solar irradiance sensor is provided, the method comprising the steps of; providing an orientation—unknown solar irradiance sensor having solar irradiance sensor data in a computer processor; storing the solar irradiance sensor data in a computer processor; filtering the solar irradiance sensor data day by day for favorable weather conditions by a computer processor to provide filtered solar irradiance sensor data for each filtered day; identifying and saving the start of production, peak of production and end of production for each filtered day in a computer processor; calculating a skew of observation for each said solar irradiance sensor by a computer processor according to the start of production, peak of production and end of production for each filtered day; calculating the orientation of said solar irradiance sensor by a computer processor according to said skew of observation; setting said orientation for the orientation-unknown solar irradiance sensor to become an orientation-known solar irradiance sensor that becomes part of a set of orientation-known solar irradiance sensors in a computer processor. The solar irradiance sensor data may be simulated solar irradiance sensor data according to environmental conditions at the location of the solar irradiance sensor. The environmental conditions may be estimated and/or observed.

Figure 6:
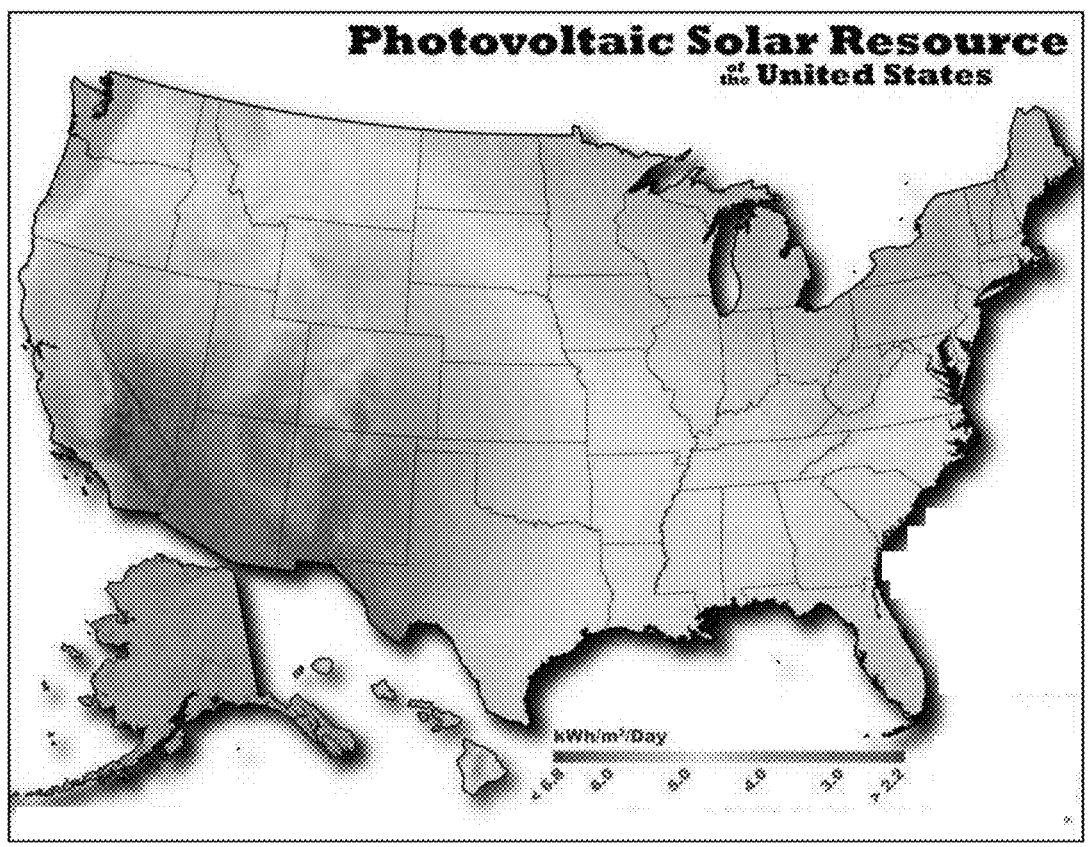
FIG. 6 depicts the present invention.

There may be observation skew based orientation identification logic. This is logic for identifying a PV system's orientation based on the skew of energy production. This logic can also identify a solar irradiance sensor's orientation based on the skew of observed solar irradiance. FIG. 6 depicts an irradiance map. Note that typically, an irradiance map may provide the amount of solar radiation in $kWh/m^2/day$. Theoretically, hardware oriented due North or South should have even production or solar irradiance measurements in the morning and evening and deviations from this relationship are caused by changes in orientation.

The Methodology is comprised of the following, background variables, input parameters and logic based on those variables parameters. There may be a renewable energy system with unknown or incorrect orientation feed. This is a feed providing production data and time from a renewable energy system with an unknown or incorrect orientation. Renewable energy systems include, but are not limited to, solar power systems and wind power systems. Typically, there is a PV SYSTEM production feed. This feed provides data on a PV systems energy production. Variables include energy production, time, and location among others.

There may be a solar irradiance sensor with unknown or incorrect orientation feed. This is a feed providing environmental condition data and time from an environmental sensor with an unknown or incorrect orientation. Environmental sensors include, but are not limited to, solar irradiance sensors, wind sensors, and temperature sensors. Typically, there is a solar irradiance sensor feed. This feed provides data about the amount of solar irradiance received by a solar irradiance sensor. Variables include solar irradiance observed, time, and location among others. There may be an environmental conditions model/feeds. These are models and feeds that provide data on environmental conditions vital to photovoltaic energy production. This includes, but is not limited to, solar irradiance sensor feeds, solar irradiance models, wind sensor feeds, and temperature sensor feeds. There may also be PV system production models. These are models that simulate the energy production for a PV system using environmental condition models/feeds.

Methods for solving search and optimization problems may include, but are not limited to, brute force search, simulated annealing, and greedy algorithm.

There may be environmental condition models and feeds. These are models and feeds that provide data on environmental conditions vital to renewable energy production. This includes, but is not limited to, solar irradiance, wind, and temperature models and feeds.

There may be renewable energy system production models. These are models that simulate the energy production for a variety of renewable energy systems using environmental condition models/feeds. These renewable energy system models include, but are not limited to, photovoltaic, solar thermal, and wind models.

There may be weather filter logic. This is logic that leverages the relationship between favorable weather and high renewable energy production and filters days of production for those days with good weather.

There may be observation event detection logic. This is empirically derived logic for identifying the start, peak, and end of production for a PV system and observed irradiance for a solar irradiance sensor.

There may be correlation based orientation and tilt identification logic. This is logic for identifying PV system orientation and tilt based on the correlation of energy production by systems at the same location with similar orientation and tilt. This is logic also for identifying solar irradiance sensor orientation and tilt based on correlation of measured solar irradiance at the same location with similar orientation and tilt. This correlation occurs because hardware with similar orientation and tilt receive similar solar irradiance.

There may be a correlation based PV orientation and tilt detection model. This is a model that detects orientation and tilt of PV systems using correlation based identification logic. The model leverages search problem methods, environmental condition models/feeds, and PV system production models in order to simulate production, which is then correlated with the PV system production feed to identify orientation and tilt.

There may be a correlation based solar irradiance sensor orientation and tilt detection model. This is a model that detects orientation and tilt of solar irradiance sensors using correlation based identification logic. The model leverages search problem methods and environmental condition models/feeds in order to estimate solar irradiance, which is then correlated with the solar irradiance sensor feed to identify orientation and tilt.

There may be an observation skew based PV orientation detection model. This is a model that detects orientation of PV systems using observation skew based identification logic. The model leverages weather filter logic and observation event detection logic in order to identify orientation.

There may be an observation skew based solar irradiance sensor orientation detection model. This is a model that detects orientation of solar irradiance sensors using observation skew based identification logic. The model leverages weather filter logic and observation event detection logic in order to identify orientation.

The Correlation Based Renewable Energy System Location Identification Model approach identifies the location of a renewable energy system by finding the systems it is most highly correlated with in terms of energy production. The correlation approach works, because renewable energy systems share the same environmental conditions if they are located in the same area, and they therefore will have similar behavior in terms of output. This correlation holds on a large geographic scale, so we can use the correlation effect to find neighboring renewable energy systems, and therefore to locate a renewable energy system if we have other systems with known locations to start with. Additionally with weather condition data and system production models, "known" locations can be simulated and the aforementioned logic can be applied.

Definition of Variables.

Correlation Based PV System Orientation and Tilt Identification Models.

Definition of Variables

Orientation angle=Angle at which PV system is directed.

Tilt angle=Angle at which PV system is raised.

Environmental conditions=Estimated or observed solar irradiance, wind speed, temperature, and other variables.

PV system production=Observed PV system energy generation.

Simulated PV system production=Simulated PV system energy generation given environmental conditions at orientation and tilt pairs.

Model

Search through all orientation and tilt angle pairs.

Estimate or observe environmental conditions at each pair.

Simulate PV system production based on environmental conditions at each pair.

Calculate correlation of unknown system's production with all simulated orientation and tilt pairs.

Set unknown system's orientation and tilt to the orientation and tilt of the most correlated simulation Correlation Based Solar Irradiance Sensor Orientation and Tilt Identification Models Definition of Variables Orientation angle=Angle at which solar irradiance sensor is directed.

Tilt angle=Angle at which solar irradiance sensor is raised

Environmental conditions=Estimated or observed solar irradiance, wind speed, temperature, and other variables.

Solar irradiance sensor observations=Observed solar irradiance measurements.

Simulated solar irradiance sensor observations=Simulated solar irradiance measurements given environmental conditions at orientation and tilt pairs.

Model

Search through all orientation and tilt angle pairs.

Estimate or observe environmental conditions at each pair.

Calculate correlation of unknown sensor's production with all simulated orientation and tilt pairs.

Set unknown sensor's orientation and tilt to the orientation and tilt of the most correlated simulation Observation Skew Based PV System Orientation Detection Model Definition of Variables PV system production=Observed PV system energy generation.

Production start=Start of PV system energy generation.

Production peak=Peak of PV system energy generation.

Production end=End of PV system energy generation.

Time of productions start (TimeOfStart)=Time of start of PV system energy generation.

Time of production peak (TimeOfPeak)=Time of start of PV system energy generation.

Time of production end (TimeOfEnd)=Time of start of PV system energy generation.

Skew=Time difference between start to peak of production and peak to end of production.

Orientation angle=Angle at which solar irradiance sensor is directed.

Model

Filter PV production data day by day for favorable weather conditions

Identify start, peak, and end of production each filtered day

Calculate skew of observation

Skew=abs(median(TimeOfPeak)−median(TimeOfStart))−abs(median(TimeOfPeak)−median(TimeOfEnd))

Calculate orientation

Orientation=Skew*0.7+180

Observation Skew Based Solar Irradiance Sensor Orientation Detection Model

Definition of Variables

Solar irradiance observations=Observed solar irradiance sensor measurements

Observation start=Start of Solar irradiance sensor observation

Observation peak=Peak of Solar irradiance sensor observation

Observation end=End of Solar irradiance sensor observation

Time of observation start=Time of start of solar irradiance sensor observation

Time of observation peak (TimeOfPeak)=Time of start of solar irradiance sensor observation Time of observation end (TimeOfEnd)=Time of start of solar irradiance sensor observation Skew=Time difference between start to peak of observations and peak to end of observations Orientation angle=Angle at which solar irradiance sensor is directed Model Filter solar irradiance sensor data day by day for favorable weather conditions Identify start, peak, and end of irradiance observation each filtered day Calculate skew of observation Skew=abs(median(TimeOfPeak)−median(TimeOfStart))−abs(median(TimeOfPeak)−median(TimeOfEnd))

Calculate orientation

Orientation=Skew*0.7+180

The present invention helps to understand irradiance sensor orientation and tilt and PV system orientation and tilt. It is important to know the orientation and tilt of irradiance sensors as this explains how the irradiance sensor is collecting data, which is required to fully understand the physical solar resource that is being measured. Information on these solar resources can then be applied to solve a variety of problems. Knowing orientation and tilt of a PV system explains how the PV system is configured relative to the available solar resources, which is required to fully understand how the PV system is converting the input solar resource into PV output energy. The information on the PV system's output can then be applied to solve a variety of problems. There are many situations in which verifying the orientation and tilt of a PV system or an irradiance sensor could be important. For example, to provide data cleansing of large quantities of data and to validate user input. There are also many situations in which automatically discovering the orientation and tilt of a PV system or irradiance sensor could be important. For example, to support smart-grid systems by automatically figuring out the configuration of an irradiance sensor or PV system (because smart-grid assets may not be centrally registered, and this information may not be available otherwise). In data aggregation and re-packaging situations the full registration information may not be available, so the orientation and tilt would need to be automatically added to the data sets. System modeling purposes, where orientation and tilt information may be a critical part of the estimation process (e.g., to forecast system output one may need to assess historical behavior/performance under different weather conditions, so knowing the orientation and tilt allows one to link the performance and weather data together).

Orientation and tilt detection of photovoltaic system may be determined using system energy production and/or using simulated system energy production. The orientation and tilt detection of a solar irradiance sensor may be determined using sensor solar irradiance observation and/or using simulated solar irradiance observation. The orientation detection of photovoltaic systems may be determined using system energy production and/or using skew of production. Orientation detection of solar irradiance sensor may be determined using sensor solar irradiance observation and/or using skew of observation.

Automatic Detection of PV System Configuration

Distributed solar energy is rapidly growing, and with that growth there is increasing need for software tools to validate data collected on PV system configuration. Clean configuration data is the foundation for most fleet performance modeling analytics, but large-scale deployments' data on location, orientation, and tilt are generally subject to human error. We will cover a number of techniques to automatically validate location, orientation and tilt data.

Location detection: Combining three methodologies to determine location is often accurate within 10 miles.

Solar noon: By statistically determining a system's solar noon, the system's longitude can be extracted from astronomical calculations Neighbor correlation: System location can be triangulated by correlating the system's production with production data from a network of solar projects with known locations.

Weather & irradiance model simulations: By simulating production using historical weather data and satellite-based irradiance models, an installed system's location can be determined by comparing simulated vs. actual production.

Orientation and tilt detection: Combining two methodologies to determine orientation and tilt provides solid data-quality guardrails.

Daily start, peak, and end times: System orientation is indicated by the time difference between start to peak, and peak to end, of a typical system production profile.

Weather & irradiance model simulations: Orientation and tilt can be found by comparing actual vs. simulated output from a search through potential orientation and tilt angles.

It should be understood that the foregoing relates to preferred embodiments of the invention and that modifications may be made without departing from the spirit and scope of the invention as set forth in the following claims.

We claim:

1. A computer processor implemented method of identifying the orientation of a renewable energy system, said method comprising the steps of;

providing at least one orientation unknown renewable energy system having production data in a computer processor;

filtering said production data day by day for favorable environmental conditions by a computer processor to provide filtered production data for each filtered day;

identifying and saving start of production, peak of production and end of production for each filtered day in a computer processor;

calculating a skew of observation for said at least one orientation unknown renewable energy systems by a computer processor according to the start of production, peak of production and end of production for each filtered day;

calculating an orientation for said at least one orientation unknown renewable energy systems by a computer processor according to said skew of observation;

setting said orientation for said at least one orientation unknown renewable energy systems to become an orientation known renewable energy system that becomes part of a set of orientation known renewable energy systems in a computer processor.

2. A method as in claim 1, wherein said production data is simulated production data according to environmental conditions at said orientation unknown renewable energy systems location.

3. A method as in claim 2, wherein said environmental conditions are estimated.

4. A method as in claim 2, wherein said environmental conditions are observed.

5. A method as in claim 1, wherein the renewable energy systems is selected from the group consisting of photovoltaic system, solar thermal system, concentrated solar power system and wind turbine.

6. A computer processor implemented method of identifying the orientation of a solar irradiance sensor, said method comprising the steps of;

providing an orientation—unknown solar irradiance sensor having solar irradiance sensor data in a computer processor;

filtering said solar irradiance sensor data day by day for favorable weather conditions by a computer processor to provide filtered solar irradiance sensor data for each filtered day;

identifying and saving start of production, peak of production and end of production for each filtered day in a computer processor;

calculating a skew of observation for said orientation unknown solar irradiance sensor by a computer processor according to the start of production, peak of production and end of production for each filtered day;

calculating the orientation of said orientation unknown solar irradiance sensor by a computer processor according to said skew of observation;

setting said orientation for the orientation unknown solar irradiance sensor to become an orientation-known solar irradiance sensor that becomes part of a set of orientation known solar irradiance sensors in a computer processor.

7. A method as in claim 6, wherein said solar irradiance sensor data is simulated solar irradiance sensor data according to environmental conditions at the location of said orientation unknown solar irradiance sensor.

8. A method as in claim 7, wherein said environmental conditions are estimated.

9. A method as in claim 7, wherein said environmental conditions are observed.

* * * * *